US007152150B2

United States Patent
Sato et al.

(10) Patent No.: US 7,152,150 B2
(45) Date of Patent: Dec. 19, 2006

(54) DRAM HAVING SRAM EQUIVALENT INTERFACE

(75) Inventors: Ayako Sato, Kawasaki (JP); Masato Matsumiya, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 254 days.

(21) Appl. No.: 10/206,110

(22) Filed: Jul. 29, 2002

(65) Prior Publication Data

US 2003/0145184 A1     Jul. 31, 2003

(30) Foreign Application Priority Data

Jan. 31, 2002  (JP)  ............................. 2002-023895

(51) Int. Cl.
*G06F 12/00*  (2006.01)
(52) U.S. Cl. ....................... 711/168; 711/105
(58) Field of Classification Search ........ 711/104–105, 711/167, 106, 168
See application file for complete search history.

(56) References Cited

U.S. PATENT DOCUMENTS

| | | | |
|---|---|---|---|
| 6,459,650 B1* | 10/2002 | Lin ............................. 365/233 |
| 6,484,246 B1* | 11/2002 | Tsuchida et al. ............ 711/169 |
| 6,542,959 B1* | 4/2003 | Tabo ........................... 711/106 |
| 6,643,732 B1* | 11/2003 | Shih ............................ 711/106 |
| 6,751,157 B1* | 6/2004 | Leung ......................... 365/233 |
| 2002/0138687 A1* | 9/2002 | Yang et al. ................. 711/105 |
| 2003/0063512 A1* | 4/2003 | Takahashi et al. .......... 365/222 |

* cited by examiner

*Primary Examiner*—Matthew Kim
*Assistant Examiner*—Shane M. Thomas
(74) *Attorney, Agent, or Firm*—Arent Fox PLLC (57) ABSTRACT

A semiconductor memory device includes a memory core circuit, a command circuit which receives commands from an exterior of the device at intervals at least as long as a minimum command cycle, a timing generator configured to request a read access to the memory core circuit immediately after inputting of a read command if a command supplied from the exterior to the command circuit is the read command, to perform a read operation on the memory core circuit immediately after the request of the read access if there is no currently performed operation in the memory core circuit, to request a write access to the memory core circuit after data is fixed prior to an end of a command cycle during which a write command corresponding to the write access is entered from the exterior to the command circuit, to perform a write operation on the memory core circuit immediately after the request of the write access if there is no currently performed operation in the memory core circuit, and to control an order of a plurality of accesses if the plurality of accesses conflict with each other with regard to access to the memory core circuit.

10 Claims, 7 Drawing Sheets

DRAM HAVING SRAM EQUIVALENT INTERFACE

BACKGROUND OF THE INVENTION

1. Field of the Invention

The present invention generally relates to DRAMs, and particularly relates to a DRAM having an interface that is equivalent to that of SRAMs.

2. Description of the Related Art

SRAMs (static random access memories) are mainly used as memory devices in the certain type of electronic equipment such as cellular phones. In general, however, SRAMs have low circuit density, so that a cost increase is on a large scale when there is a need to increase memory size. On the other hand, DRAMs (dynamic random access memories) are suitable for the purpose of achieving large memory size at low costs. Accordingly, it is desirable to provide a DRAM having an interface equivalent to that of SRAMs in order to utilize the accumulated asset of existing systems based on the use of SRAMs.

There are several aspects in which the control scheme is different between DRAMs and SRAMs. One of such differences is a timing specification that defines the timing of address inputs for data write/read operations. In the SRAMs, memory cells are comprised of flip-flops, thereby allowing a non-destructive data read operation that does not destroy memory contents at the time of memory access. A memory cell position from which data is retrieved and output to the exterior of the device during a read operation thus changes by following changes in input addresses, and so does a memory cell position at which data is written after the inputting of data from the exterior of the device during a write operation. When there is a command input, and the address is retained for a predetermined time period, then, the address becomes a valid address to be accessed. In this manner, a decision as to whether access is made to a specified address is determined after the predetermined time period following the storing of the specified address.

DRAM memory cells, on the other hand, only allow a destructive read operation that destroys the data contents at the time of memory access. In the DRAMs, therefore, it is necessary to restore the data of sense amplifiers in the memory cells at the time of memory access. During this restore operation, the read address cannot be changed to access different memory cells. The address supplied at the start of data read/write operation is thus stored in internal latches, thereby keeping the latched address unchanged during the read/write to the cell. In this manner, the address and data are fixed at the start of an access operation, and it is rather difficult to fix them a predetermined time after the start of access.

When there is a need to provide compatibility between the DRAM and the SRAM as described above, a write operation presents a major problem. As for a read operation, data outputs can be obtained with some delay from the inputting of an address to the DRAM such that the delay is compatible with the delay from the inputting of an address to the SRAM to the outputting of data. In the case of a write operation, however, an access to a specified address becomes valid only after the address is retained for a predetermined time period and data inputs are fixed. If an attempt is made in the DRAM to write data at the address that is given when the data inputs are fixed, a series of write operation steps must be started after this timing, resulting in the write operation being carried out in the following command cycle. If the operation of the following command cycle is a read operation or the like that begins immediately after the inputting of a command, the read operation of this cycle clashes with the write operation that is delayed from the previous cycle. This results in either one of these operations being not performed.

In order to obviate this, DRAMs having an equivalent interface to SRAMs typically have a buffer that temporarily store data and an address supplied from the exterior of the device, and the data of the buffer is stored in the specified memory cells at the time of a next write operation. Namely, the data and address entered from the exterior of the device at the time of a first write operation are temporarily stored in the buffer when the data and address are fixed, and the data of the buffer is written at the memory cell position specified by the address of the buffer at the time of a second write operation. Data and an address newly entered with reference to the second write operation are stored in the buffer when the data and address are fixed, thereby preparing for a next (third) write operation.

In this manner, actual write operations directed to memory cells are delayed by one write access, so that access to the memory core can be made from the beginning of a given write operation cycle, thereby providing an interface equivalent to SRAMs in terms of the specifications of the write operation.

Further, there is a need to periodically refresh data of memory cells in the DRAMs while there is no need for refresh operations in the SRAMs. In the DRAMs that operate like SRAMs, therefore, refresh operations should be automatically performed inside the device at the proper refresh timing in such a manner that the refresh operations are concealed from outside the device. To this end, a refresh operation needs to be carried out within a single command cycle even if a write operation or a read operation is performed in the same command cycle.

In order to achieve this, the period of a core operation required for a single access may be set half as long as a minimum command input cycle. With this provision, all the necessary operations can be performed within a single command input cycle even if a refresh operation collides with a write operation or a read operation.

In the related-art, various provisions as described above were made so as to provide a DRAM having an interface equivalent to that of SRAMs.

However, the configuration as described above needs a buffer circuit for the purpose of temporarily storing data and an address, so that the larger the number of bits of input/output data is, the larger the size of the buffer circuit. Further, since the data that was last stored in the buffer is not yet written in the memory core, there is a need to access the buffer instead of the memory core when reading data that was last written. Moreover, the address that is entered from the exterior of the device is different from the core address that is being accessed. In this manner, the configuration provided with the buffer for data write operation has problems in that the circuit configuration and timing control become undesirably complicated.

Accordingly, there is a need for a semiconductor memory device that uses a DRAM memory core and provides an interface equivalent to that of SRAMs, yet does not have a buffer for the purpose of temporarily holding data and an address for write operations.

SUMMARY OF THE INVENTION

It is a general object of the present invention to provide a semiconductor memory device that substantially obviates one or more of the problems caused by the limitations and disadvantages of the related art.

Features and advantages of the present invention will be set forth in the description which follows, and in part will become apparent from the description and the accompanying drawings, or may be learned by practice of the invention according to the teachings provided in the description. Objects as well as other features and advantages of the present invention will be realized and attained by a semiconductor memory device particularly pointed out in the specification in such full, clear, concise, and exact terms as to enable a person having ordinary skill in the art to practice the invention.

To achieve these and other advantages and in accordance with the purpose of the invention, as embodied and broadly described herein, a semiconductor memory device according to the present invention includes a memory core circuit, a command circuit which receives commands from an exterior of the device at intervals at least as long as a minimum command cycle, a timing generator configured to request a read access to the memory core circuit immediately after inputting of a read command if a command supplied from the exterior to the command circuit is the read command, to perform a read operation on the memory core circuit immediately after the request of the read access if there is no currently performed operation in the memory core circuit, to request a write access to the memory core circuit after data is fixed prior to an end of a command cycle during which a write command corresponding to the write access is entered from the exterior to the command circuit, to perform a write operation on the memory core circuit immediately after the request of the write access if there is no currently performed operation in the memory core circuit, and to control an order of a plurality of accesses if the plurality of accesses conflict with each other with regard to access to the memory core circuit.

The semiconductor memory device as described above further includes a refresh timing generation circuit which generates a refresh instruction at predetermined intervals so as to refresh the memory core circuit, the timing generator responding to the refresh instruction by performing a refresh operation on the memory core circuit immediately after the refresh instruction if there is no currently performed operation in the memory core circuit.

In the semiconductor memory device as described above, if there is a currently performed operation in the memory core circuit, the timing generator performs an access operation on the memory core circuit after the currently performed operation is completed.

The timing generator operates in response to the read command, the write command, and the refresh instruction, thereby processing accesses in the order in which access requests are made if there is no conflict between accesses. If there is access conflict, the timing generator processes the accesses in a proper order that does not cause operational problems.

With the timing generator controlling the timing of access to the core circuit, the present invention can provide a semiconductor memory device that performs a read operation, a write operation, and a refresh operation at proper timing without having a buffer for temporarily holding data and an address for the purpose of write operations.

Other objects and further features of the present invention will be apparent from the following detailed description when read in conjunction with the accompanying drawings.

DESCRIPTION OF THE PREFERRED EMBODIMENTS

In the following, embodiments of the present invention will be described with reference to the accompanying drawings.

Figure 1:
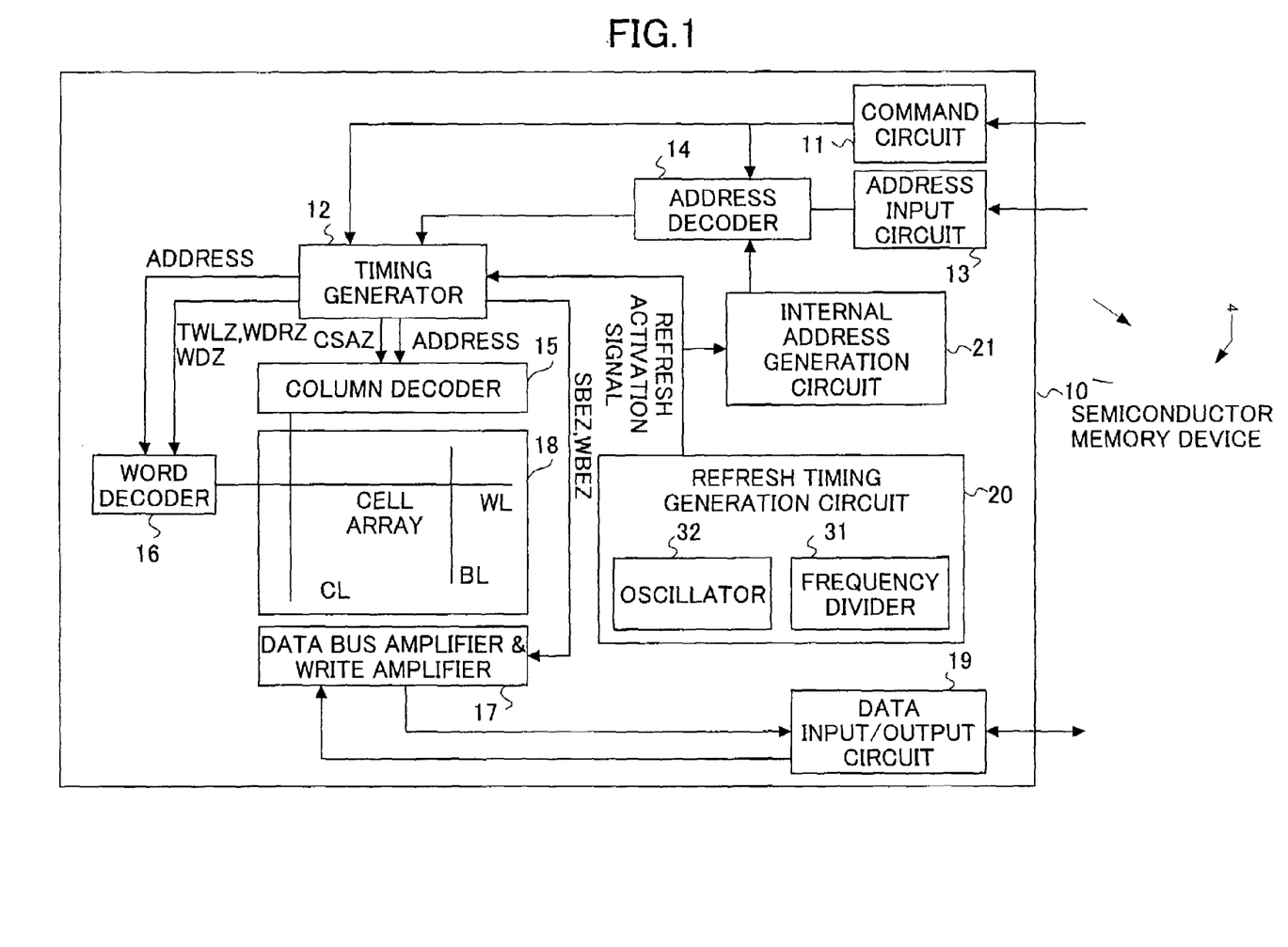
FIG. 1 is a block diagram of a semiconductor memory device according to the present invention.

FIG. 1 is a block diagram of a semiconductor memory device according to the present invention.

The semiconductor memory device 10 of FIG. 1 includes a command circuit 11, a timing generator 12, an address input circuit 13, an address decoder 14, a column decoder 15, a word decoder 16, a data bus amplifier & write amplifier 17, a core circuit 18, a data input/output circuit (DQ) 19, a refresh timing generation circuit 20, and an internal address generation circuit 21.

The command circuit 11 includes an input circuit for receiving commands and a clock signal from an exterior of the device, and further includes a command decode/control unit for controlling individual units of the semiconductor memory device 10 according to command decoding results. The timing generator 12 receives the decoding results and the clock signal from the command decode/control unit of the command circuit 11, and generates timing signals for controlling various operations. These signals are supplied to various units inside the semiconductor memory device 10.

The address input circuit 13 receives address signals from the exterior of the device, and supplies the address to the address decoder 14 at proper timing. The address decoder 14 decodes the received address, and supplies the decoding results to the timing generator 12. The timing generator 12 holds the supplied decoded address, and supplies it to the word decoder 16 and the column decoder 15 at proper timing.

The word decoder 16 activates a word line indicated by the decoded address, thereby supplying data of memory cells to sense amplifiers via bit lines where the data of the memory cells connected to the activated word line are selected by a column line. These word lines, bit lines, sense amplifiers, and so on are provided in the core circuit 18. The column decoder 15 activates a column selection line of a column indicated by the decoded address, so that the data of sense amplifiers connected to the activated column selection line are connected to a data bus. Through this data bus, data exchange is conducted between the sense amplifiers and the data bus amplifier 17.

The data bus amplifier 17 supplies the read data to the data input/output circuit 19. The data input/output circuit 19 provides the read data to the exterior of the semiconductor memory device 10, and receives data to be written from the exterior of the device. The data to be written is transferred via the write amplifier 17, the data bus, sense amplifiers, bit lines, etc., to be stored in the memory cells of a selected word at the location selected by a column line.

The refresh timing generation circuit 20 includes a frequency divider 31 and an oscillator 32. The oscillator 32 oscillates to generate periodic pulses. The frequency divider 31 divides the frequency of the generated periodic pulses, thereby generating a refresh activation signal at constant refresh intervals.

In response to the refresh activation signal, the internal address generation circuit 21 generates an address at which a refresh operation is to be performed, and supplies this address to the address decoder 14. The refresh activation signal is also supplied to the timing generator 12. Responsive to the refresh activation signal, the timing generator 12 generates various timing pulses for executing a refresh operation at proper timing, and provides the generated timing pulses to the column decoder 15, the word decoder 16, the data bus amplifier & write amplifier 17, etc.

Figure 2:
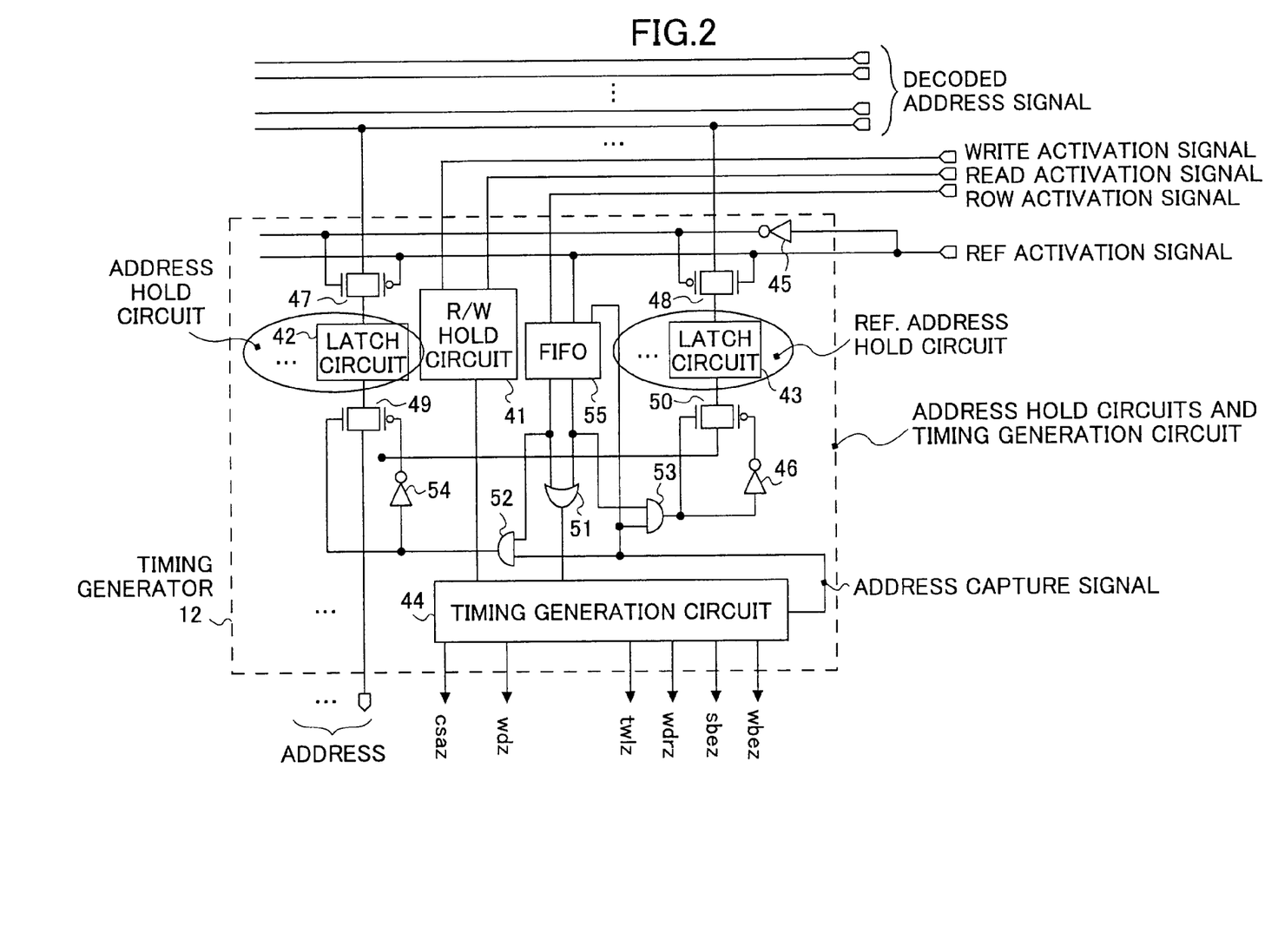
FIG. 2 is a block diagram showing the configuration of a timing generator.

FIG. 2 is a block diagram showing the configuration of the timing generator 12.

The timing generator 12 of FIG. 2 includes a R/W hold circuit 41, an address hold circuit 42, a refresh address hold circuit 43, a timing generation circuit 44, inverters 45 and 46, transfer gates 47 through 50 each comprised of a PMOS transistor and an NMOS transistor, an OR circuit 51, AND circuits 52 and 53, an inverter 54, and a FIFO circuit 55.

The R/W hold circuit 41 receives a Write activation signal or a Read activation signal as command decoding results from the command circuit 11. The Write activation signal is activated when a Write operation is specified by command signals supplied from the exterior of the device. The Read activation signal is activated when a Read operation is specified by command signals supplied from the exterior of the device. In response to the Write activation signal and the Read activation signal, the R/W hold circuit 41 keeps therein the access state of an entered address (i.e., indicating either a write state or a read state). The access state held by the R/W hold circuit 41 is supplied to the timing generation circuit 44 as a signal indicative of the access state.

The address hold circuit 42 is a latch circuit that latches address signals supplied from the address decoder 14 when the refresh activation signal from the refresh timing generation circuit 20 is LOW indicating the absence of a refresh operation. The transfer gate 47 controlled by the refresh activation signal controls the address input into the address hold circuit 42. In the presence of a refresh operation, the address signals from the address decoder 14 are not supplied through the transfer gate 47. Although not explicitly shown, a plurality of address hold circuits 42 are provided as many as the number of bits of address signals (i.e., decoded address signals) supplied from the address decoder 14.

The refresh address hold circuit 43 is a latch circuit that latches address signals supplied from the address decoder 14 when the refresh activation signal from the refresh timing generation circuit 20 is HIGH indicating the presence of a refresh operation. The transfer gate 48 controlled by the refresh activation signal controls the address input into the address hold circuit 43. In the absence of a refresh operation, the address signals from the address decoder 14 are not supplied through the transfer gate 48. Although not explicitly shown, a plurality of address hold circuits 43 are provided as many as the number of bits of address signals (i.e., decoded address signals) supplied from the address decoder 14.

The FIFO circuit 55 receives a row activation signal indicative of an access operation supplied from the command circuit 11, and further receives a refresh activation signal supplied from the refresh timing generation circuit 20 that indicates a refresh operation. The FIFO circuit 55 stores therein the received signals in the order in which they are received. After this, the FIFO circuit 55 responds to a trigger that is the address capture signal supplied from the timing generation circuit 44, by outputting the row activation signal and the refresh activation signal in the order of arrival. The storage function of the FIFO circuit 55 makes it possible to keep activation signals intact even when accesses coincide with each other. Here, the row activation signal indicates the activation of a word line (i.e., a row), and is generated by the command circuit 11 when a read command or a write command is supplied to the command circuit 11 from the exterior of the device.

The OR circuit 51 receives the row activation signal indicative of an access operation and the refresh activation signal indicative of a refresh operation as they are supplied from the FIFO circuit 55. The OR circuit 51 obtains an OR logic between the two signals, and supplies the OR logic output to the timing generation circuit 44.

The timing generation circuit 44 includes a logic circuit comprised of delay circuits, thereby generating various timing signals at respective timings in response to the output signal from the OR circuit 51. Namely, as access is requested by a read command or a write command supplied from the exterior of the device, or as a refresh operation is instructed at the timing that is internally generated, a response is made by producing timing signals csaz, wdz, twlz, wdrz, sbez, and wbez. The timing signal csaz is supplied to the column decoder 15 to control the timings at which a column line is activated and reset. The timing signals twlz and wdrz define the timings at which the core circuit 18 such as sense amplifiers is activated and reset, and control the core circuit 18 via the word decoder 16. The timing signal wdz determines the activation timing and the reset timing of a word line, and is supplied to the word decoder 16. The timing signal sbez activates the data bus amplifier of the data bus amplifier & write amplifier 17, and the timing signal wbez activates the write amplifier of the data bus amplifier & write amplifier 17.

The timing generation circuit 44 generates an address capture signal at proper timing to open the transfer gate 49 or 50, thereby selecting an address that is subjected to a read/write operation or a refresh operation. The selected address is supplied to the column decoder 15 and the word decoder 16. When this happens, the AND circuit 52 performs an AND operation between the row activation signal from the FIFO circuit 55 and the address capture signal from the timing generation circuit 44, thereby letting the address of a routine access pass through the transfer gate 49. Further, the AND circuit 53 performs an AND operation between the refresh activation signal from the FIFO circuit 55 and the address capture signal from the timing generation circuit 44, thereby letting the address of a refresh operation pass through the transfer gate 49.

Figure 3:
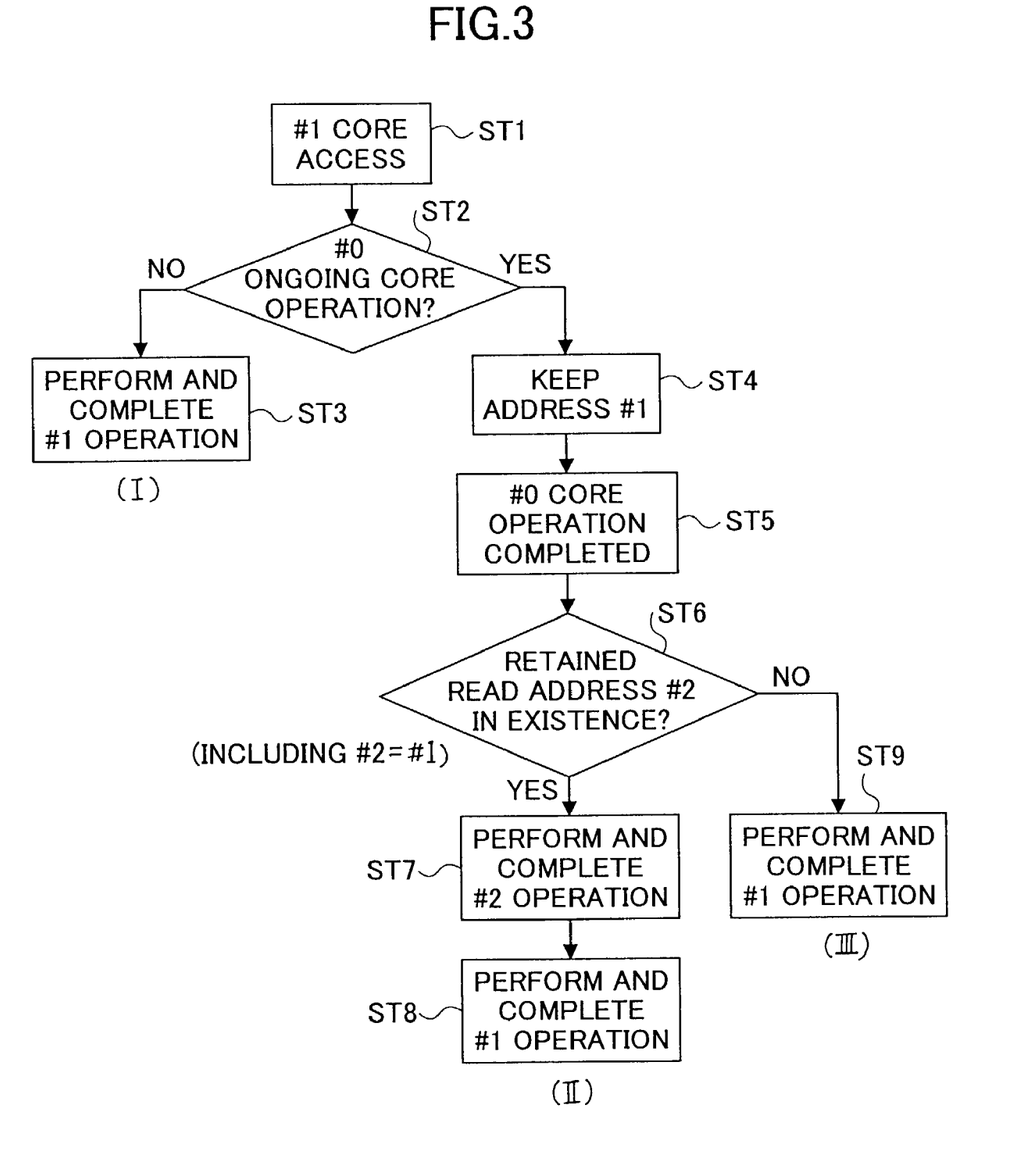
FIG. 3 is a flowchart showing the operation of the timing generator.

FIG. 3 is a flowchart showing the operation of the timing generator 12.

At step ST1, a request is made for access to a first address #1 of the core circuit 18. This request is either a read operation request R, a write operation request W, or a refresh operation request Ref, and is detected by the timing generation circuit 44 of the timing generator 12. At step ST2, a check is made as to whether the core circuit 18 is currently operating (with respect to the address #0). This check is made by the timing generation circuit 44 that controls the operation of the core circuit 18 through the word decoder 16.

If the core circuit 18 is not operating, at step ST3, the requested operation directed to the first address #1 is performed and completed. This is done by supplying the address signals and timing signals from the timing generator 12 to the column decoder 15, the word decoder 16, and the data bus amplifier & write amplifier 17.

If the core circuit 18 is operating, the procedure goes to step ST4. At the step ST4, an address #1 that is a current access target is stored in memory while performing a core operation with respect to the address #0 that is a previous access target. At step ST5, the completion of the core operation with respect to the address #0 is waited for.

When the timing generation circuit 44 detects the completion of the core operation regarding the address #0, at step ST6, a check is made as to whether an address #2 for an unprocessed read operation request is retained in the address hold circuit 42. The address #2 for the read operation request may be the address #1 of the current access target, or may be the address #2 that is another access target. For example, a read operation request is made with respect to the address #2 before the current access request directed to the address #1 is processed or while the current access request is being processed. In such a case, the two access requests end up waiting for the completion of the core operation regarding the address #0. A check as to whether there is an unprocessed read operation request is made by the timing generation circuit 44 of the timing generator 12.

If there is the retained address #2 for the read operation request, at step ST7, the core operation directed to the address #2 is carried out, and the completion thereof is waited for. At step ST8, an action directed to the specified address #1 is performed and completed. This is done by supplying the address signals and timing signals from the timing generator 12 to the column decoder 15, the word decoder 16, and the data bus amplifier & write amplifier 17.

If there is no retained address for the read operation request, at step ST9, an action directed to the specified address #1 is performed and completed. This is done by supplying the address signals and timing signals from the timing generator 12 to the column decoder 15, the word decoder 16, and the data bus amplifier & write amplifier 17.

In this manner, the timing generator 12 operates in response to the read operation request R, the write operation request W, or the refresh operation request Ref, so that access operations are performed in the order of arrival of access requests if there is no access conflict in the core circuit 18, whereas the access operations are performed in a proper order that does not cause operational problems if there is an access conflict. With the timing generator 12 controlling the timing of access to the core circuit 18, the present invention can provide a semiconductor memory device that performs a read operation, a write operation, and a refresh operation at proper timings without having a buffer for temporarily holding data and an address for the purpose of write operations.

In the following, the operation of the semiconductor memory device according to the present invention will be described in further detail.

The semiconductor memory device according to the present invention performs core operations in the order in which access requests are made if there is no access conflict in the core circuit. This corresponds to the execution and completion of an operation according to the procedure I in FIG. 3. If there is an access conflict in the core circuit, an access operation is performed and completed according to the procedure II or III in the flowchart of FIG. 3.

Figure 4A:
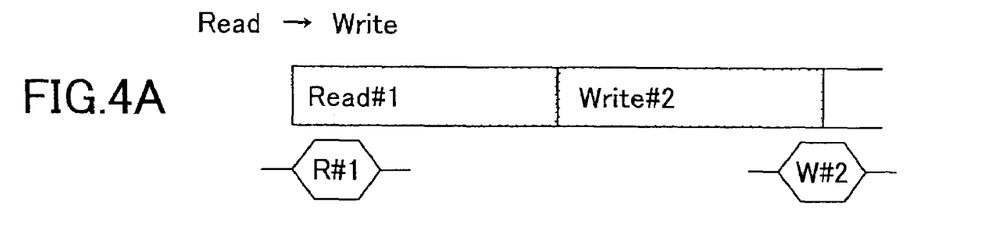
FIGS. 4A through 4D are illustrative drawing showing the timing at which a write operation and a read operation are carried out.
Figure 4B:
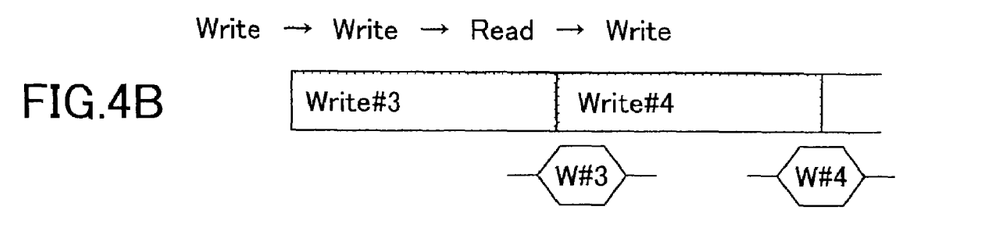
Figure 4C:
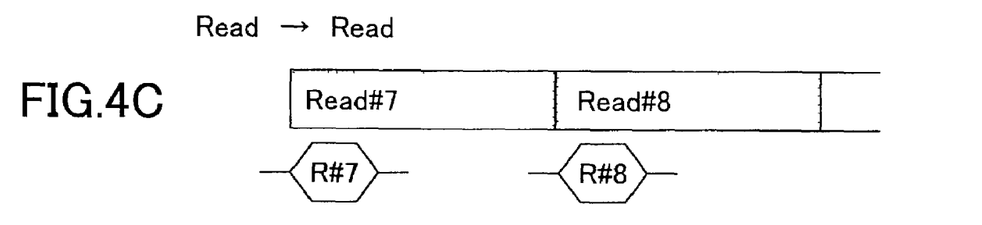

FIGS. 4A through 4D are illustrative drawing showing the timing at which a write operation and a read operation are carried out. In each figure, the rectangles at the top each indicate a minimum command cycle, and hexagons below the rectangles each represent a core operation. FIG. 4A shows a case in which a write command is entered following a read command, and FIG. 4B shows a case in which two write commands are entered successively. FIG. 4C illustrates a case in which two read commands are entered successively, and FIG. 4D demonstrate a case in which a read command is entered following a write command.

In FIGS. 4A through 4C, both the read operation and the write operation are performed and completed according to the procedure I in the flowchart of FIG. 3 because no conflicting core operation is underway. It should be noted that a write core operation does not start until near the end of a write command cycle in order to provide an interface equivalent to that of SRAMs. That is, the write operation of SRAMs fixes data that is entered together with a predetermined signal after a predetermined time period during which the address is retained, and the write cycle comes to an end soon after the data is fixed. In order to achieve the same operation by use of DRAMs, a series of write operation steps needs to be started only after the data of a write command cycle is fixed. Because of this, the write operations of FIGS. 4A through 4D each start just prior to the end of the write command cycle, and the most of the core operation is carried out in the next command cycle. In contrast, read operations are performed by starting a core operation immediately after the entry of a command and the fixing of an address.

Figure 4D:
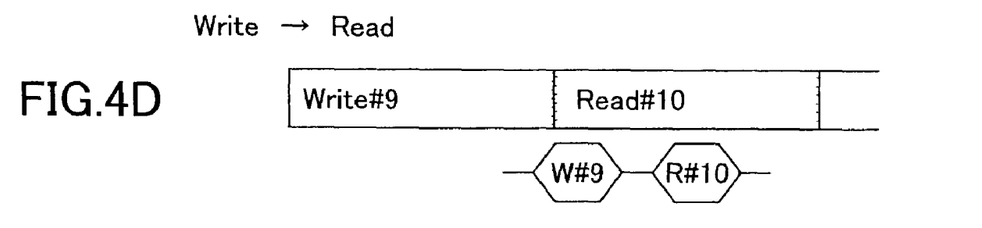

As shown in FIG. 4D, when an operation at the command cycle immediately following a write operation is a read operation that needs to be carried out immediately after the entry of a command, the write command delayed from the previous command cycle collides with the read operation of the current command cycle. In this case, either one of these operations cannot be performed unless a plan is devised in one form or another. In the present invention shown in FIG. 4D, the read operation request is processed according to the procedure II in the flowchart of FIG. 3 (corresponding to the case in which the address #1 and the address #2 are the same). In this manner, the present invention waits to perform a read operation until the currently performed core operation (i.e., the write operation of the previous command cycle) is completed (step ST5 of FIG. 3). This is achieved through timing control by the timing generator 12.

FIGS. 4A through 4D show the cases in which no refresh operation is instructed. When a refresh instruction is generated, the operation timing becomes further complicated.

Figure 5:
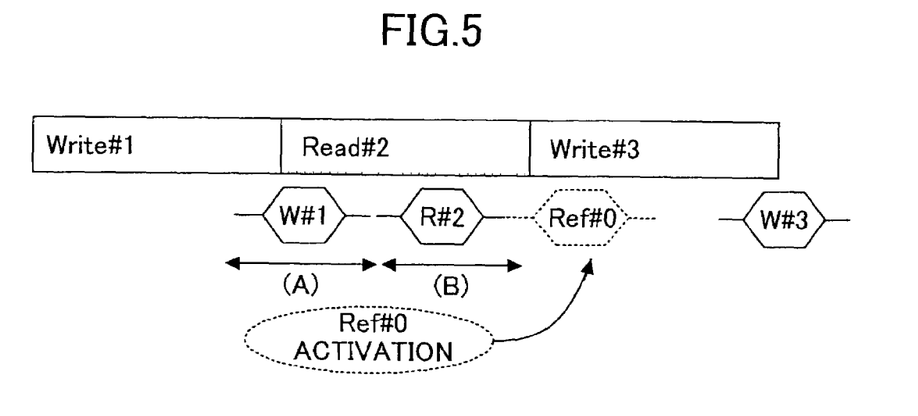
FIG. 5 is an illustrative drawing showing a case in which a read request and a refresh request are made immediately after a write request.

FIG. 5 is an illustrative drawing showing a case in which a read request and a refresh request are made immediately after a write request. The rectangles at the top each indicate a minimum command cycle, and hexagons below the rectangles each represent a core operation. An arrow (A) at the bottom indicates the period of a write core operation, and an arrow (B) indicates the period of a read core operation.

In FIG. 5, the write operation request corresponding to the address #1 is processed according to the procedure I in the flowchart of FIG. 3 since no core operation is underway at the time of request. The read operation request corresponding to the address #2 is processed according to the procedure II in the flowchart of FIG. 3 (corresponding to the case in which the address #1 and the address #2 are the same). That is, the read operation is performed only after the currently performed core operation (i.e., the write operation of the previous command cycle) is completed (step ST5 of FIG. 3).

The refresh operation, for which a request is made during the period (A) of a write core operation or the period (B) of a read core operation, is performed and completed according to the procedure II or III in the flowchart of FIG. 3. Namely, the refresh operation for which a request is made during the period (A) of a write core operation is performed and completed only after the read operation comes to an end according to the procedure II. This is because the retained address for a read operation is in existence (i.e., YES at step ST6 of FIG. 3) when the write core operation is completed. In the case of a refresh operation for which a request is made during the period (B) of a read core operation, this read core operation is the currently performed core operation that is checked at the step ST2. When this core operation comes to an end, there is no retained address for a read operation (i.e., NO at step ST6 of FIG. 3). The process is thus performed and completed according to the procedure III of the flowchart of FIG. 3.

Figure 6:
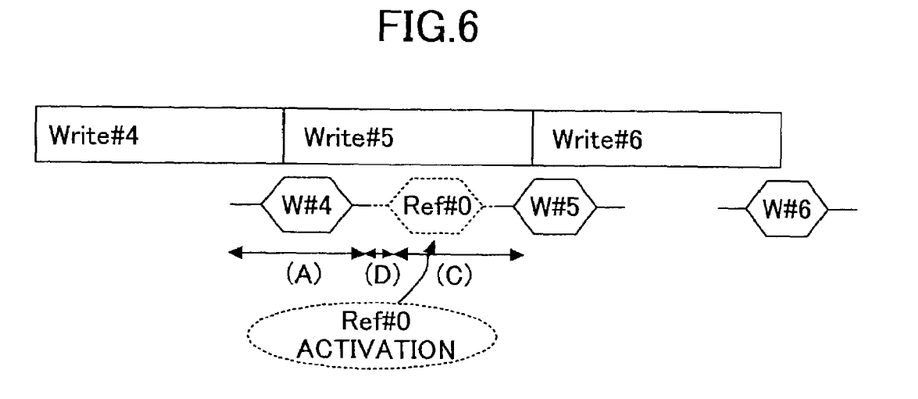
FIG. 6 is an illustrative drawing showing a case in which a write request and a refresh request are made immediately after a write request.

FIG. 6 is an illustrative drawing showing a case in which a write request and a refresh request are made immediately after a write request. An arrow (A) at the bottom indicates the period of a write core operation, and an arrow (C) represents the period of a refresh core cycle (which is the period of one core cycle that must be completed before the start of the next write core operation). An arrow (D) indicates a period between the end of the period (A) and the start of the period (C).

The write operation request corresponding to the address #4 is processed according to the procedure I in the flowchart of FIG. 3 since no core operation is underway at the time of request. The refresh operation, for which a request is made during the period (A) of a write core operation, or the period (D) that follows, or the period (C), is performed and completed according to the procedure III or I in the flowchart of FIG. 3. Namely, the refresh operation for which a request is made during the period (A) of a write core operation is performed and completed according to the procedure III. The refresh operation for which a request is made during the period (D) or the period (C) is performed and completed according to the procedure I shown in the flowchart of FIG. 3.

The write request directed to the address #5 is processed according to the procedure I or III in the flowchart of FIG. 3, depending on whether an ongoing core operation is in existence. Namely, when an access request for refresh operation is made during the period (A) of a write core operation or during the period (D), there is no ongoing core operation at the time the write request directed to the address #5 is made. The write operation is thus performed and completed according to the procedure I. When an access request for refresh operation is made during the period (C), an ongoing core operation is present at the time the write request directed to the address #5 is made. The write operation is thus performed and completed according to the procedure III.

Figure 7:
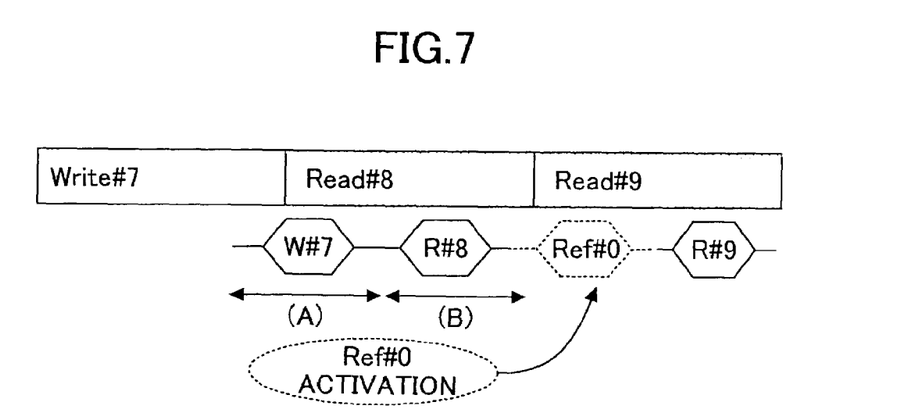
FIG. 7 is an illustrative drawing showing a case in which a read request and a refresh request are made immediately after a write request.

FIG. 7 is an illustrative drawing showing a case in which a read request and a refresh request are made immediately after a write request. FIG. 7 shows the same conditions as FIG. 5. In the case of FIG. 7, however, a read command is entered following a write command, followed by the entry of a further read command.

In the same manner as described in connection with FIG. 5, a refresh operation #0 is carried out after a read operation #8 in FIG. 7. In the example of FIG. 7, the read operation #9 following the read operation #8 is performed and completed only after the refresh operation is completed, according to the procedure III shown in the flowchart of FIG. 3.

Figure 8:
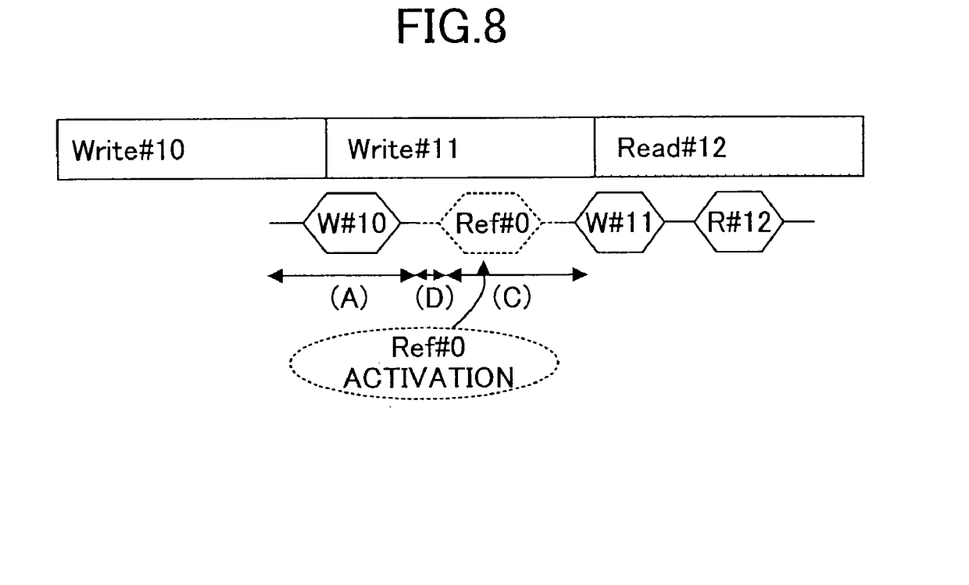
FIG. 8 is an illustrative drawing showing a case in which a write request and a refresh request are made immediately after a write request.

FIG. 8 is an illustrative drawing showing a case in which a write request and a refresh request are made immediately after a write request. FIG. 8 illustrates the same conditions as FIG. 6. In FIG. 8, however, a read command is entered after the entry of two consecutive write commands.

In the same manner as described in connection with FIG. 6, a write operation #11 is carried out after a refresh operation #0 in FIG. 8. In the example of FIG. 8, the read operation #12 following the write operation #11 is performed and completed only after the write operation comes to an end, according to the procedure III shown in the flowchart of FIG. 3.

Figure 9:
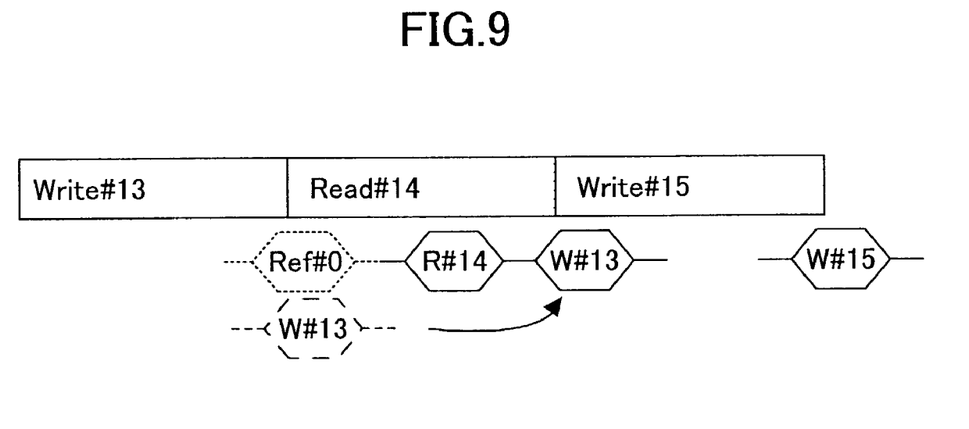
FIG. 9 is an illustrative drawing showing a case in which a write request and a read request are made immediately after a refresh request.

FIG. 9 is an illustrative drawing showing a case in which a write request and a read request are made immediately after a refresh request.

A refresh request #0 is made to the core circuit first. This refresh operation is performed and completed according to the procedure I shown in the flowchart of FIG. 3. While the core operation for this refresh operation is underway, a write request #13 is made to the core circuit. Further, while the core operation for the refresh operation is still underway, a read request #14 is made to the core circuit.

The read operation directed to the address #14 is carried out and completed according to the procedure II shown in the flowchart of FIG. 3. That is, the read operation is performed only after the ongoing core operation (i.e., the refresh operation) comes to an end (i.e., step ST5 of FIG. 3). The write operation directed to the address #13 is performed and completed according to the procedure II of the flowchart of FIG. 3. Namely, since the read request #14 is made during the core operation period of the refresh operation #0, there is a retained address for a read operation at the time the refresh core operation comes to an end (i.e., YES at step ST6 of FIG. 3). Accordingly, the completion of the read operation #14 is waited for according to the procedure II, and, then, the write operation #13 is performed and completed.

In the manner as described above, the present invention controls the timing of various operations by use of the timing generator 12, thereby making it possible to perform a read/write operation at proper timing without a need for a buffer circuit that temporarily stores data and an address for write operations. Even when the refresh request automatically generated inside the device conflicts with an externally provided command, the timing generator 12 attends to proper timing control so as to perform each operation properly.

In the case of FIG. 5 through FIG. 7, if a refresh operation is requested during the period (A) or (B), the refresh operation may be delayed and executed later. If a refresh operation is requested during the period (C), the refresh operation is performed immediately.

Figure 10:
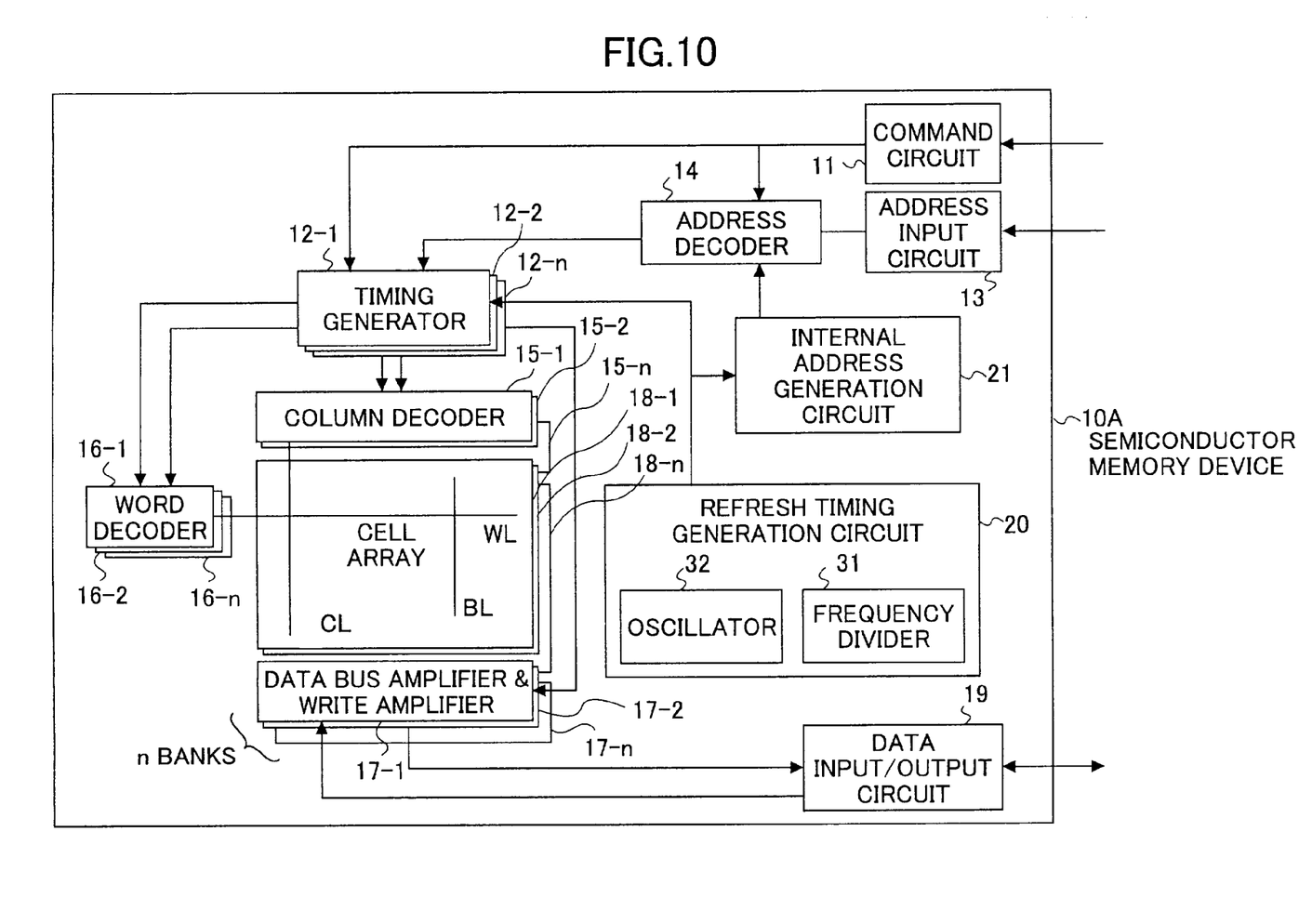
FIG. 10 is a block diagram showing another embodiment of a semiconductor memory device according to the present invention.

FIG. 10 is a block diagram showing another embodiment of a semiconductor memory device according to the present invention.

The semiconductor memory device 10A of FIG. 10 differs from the semiconductor memory device 10 of FIG. 1 in that a multi-bank configuration is employed. In the semiconductor memory device 10A of FIG. 10, a plurality of sets each including a column decoder, a word decoder, a data bus amplifier & write amplifier, and a core circuit are provided as many as there are n banks. That is, the semiconductor memory device 10A includes a plurality of column decoders 15-1, 15-2, . . . , 15-n, a plurality of word decoders 16-1, 16-2, . . . , 16-n, a plurality of data bus amplifiers & write amplifiers 17-1, 17-2, . . . , 17-n, and a plurality of core circuits 18-1, 18-2, . . . , 18-n.

Further, n timing generators 12-1, 12-2, . . . , 12-n are provided to correspond to the n respective banks. The timing generators provided for the respective banks can achieve timing control independent of each other.

Further, the present invention is not limited to these embodiments, but various variations and modifications may be made without departing from the scope of the present invention.

The present application is based on Japanese priority application No. 2002-023895 filed on Jan. 31, 2002, with the Japanese Patent Office, the entire contents of which are hereby incorporated by reference.

What is claimed is:

1. A semiconductor memory device, comprising:
a memory core circuit;
a command circuit which receives commands from an exterior of the device at intervals at least as long as a minimum command cycle; and
a timing generator configured to request a read access to said memory core circuit immediately after inputting of a read command if a command supplied from the exterior to said command circuit is the read command, to perform a read operation on said memory core circuit immediately after the request of the read access if there is no currently performed operation in said memory core circuit, to delay performing the read operation on said memory core circuit despite the request of the read access if there is a currently performed operation in said memory core circuit, to request a write access to said memory core circuit after data is fixed prior to an end of a command cycle during which a write command corresponding to said write access is entered from the exterior to said command circuit, to perform a write operation on said memory core circuit immediately after the request of the write access if there is no currently performed operation in said memory core circuit, and to check whether said memory core circuit is currently operating and thus busy, so as to control in response to the check an order in which a plurality of accesses to the memory core circuit are performed if the plurality of accesses conflict with each other with regard to access to said memory core circuit.

2. The semiconductor memory device as claimed in claim 1, further comprising a refresh timing generation circuit which generates a refresh instruction at predetermined intervals so as to refresh said memory core circuit, said timing generator responding on said refresh instruction by performing a refresh operation on said memory core circuit immediately after the refresh instruction if there is no currently performed operation in said memory core circuit.

3. The semiconductor memory device as claimed in claim 2, wherein if there is a currently performed operation in said memory core circuit, said timing generator performs an access operation on said memory core circuit after said currently performed operation is completed.

4. The semiconductor memory device as claimed in claim 3, wherein if there are two or more waiting access operations including a read operation at a time said currently performed operation is completed, said timing generator performs the read operation first and the one or more remaining waiting access operations next.

5. The semiconductor memory device as claimed in claim 3, wherein said timing generator includes:
a R/W hold circuit which holds information indicative of a command type of a command received by said command circuit in terms of either a read command or a write command;
an address hold circuit which holds a write address or a read address; and
a refresh address hold circuit which holds a refresh address.

6. The semiconductor memory device as claimed in claim 1, wherein said memory core circuit is a DRAM core circuit, and provides an interface equivalent to that of an SRAM.

7. The semiconductor memory device as claimed in claim 1, further comprising a plurality of memory core circuits operable at timing independent of each other, wherein said timing generator is provided for each of said memory core circuits.

8. A semiconductor memory device having an interface equivalent to that of an SRAM, comprising:
a DRAM core circuit; and
a timing generator configured to request a read access to said DRAM core circuit immediately after inputting of a read command, to request a write access to said DRAM core circuit substantially at a time data is fixed prior to an end of a command cycle during which a write command corresponding to said write access is entered, and to check whether said DRAM core circuit is currently operating and thus busy, so as to control in response to the check an order in which a plurality of accesses to the DRAM core circuit are performed if the plurality of accesses conflict with each other with regard to access to said DRAM core circuit, wherein performing of a read operation in said DRAM core circuit is delayed despite the request of the read access if there is a currently performed operation in said DRAM core circuit.

9. The semiconductor memory device as claimed in claim 8, further comprising a refresh timing generation circuit which generates a refresh request at predetermined intervals so as to refresh said DRAM core circuit.

10. The semiconductor memory device as claimed in claim 9, wherein if there are two or more waiting access operations including a read operation at a time a currently performed operation of said DRAM core circuit is completed, said timing generator performs the read operation first and the one or more remaining waiting access operation next.

* * * * *